United States Patent
Terakawa et al.

(10) Patent No.: US 7,807,495 B2
(45) Date of Patent: Oct. 5, 2010

(54) METHOD OF MANUFACTURING SEMICONDUCTOR FILM AND METHOD OF MANUFACTURING PHOTOVOLTAIC ELEMENT

(75) Inventors: Akira Terakawa, Nara (JP); Toshio Asaumi, Kobe (JP)

(73) Assignee: Sanyo Electric Co., Ltd., Osaka (JP)

( * ) Notice: Subject to any disclaimer, the term of this patent is extended or adjusted under 35 U.S.C. 154(b) by 198 days.

(21) Appl. No.: 12/108,120

(22) Filed: Apr. 23, 2008

(65) Prior Publication Data

US 2008/0261348 A1 Oct. 23, 2008

(30) Foreign Application Priority Data

Apr. 23, 2007 (JP) .............................. 2007-112486

(51) Int. Cl.
*H01L 21/00* (2006.01)
(52) U.S. Cl. .................... 438/96; 438/788; 438/791
(58) Field of Classification Search .................. 438/96, 438/791, 788
See application file for complete search history.

(56) References Cited

U.S. PATENT DOCUMENTS

| | | | | | |
|---|---|---|---|---|---|
| 4,237,150 | A | * | 12/1980 | Wiesmann | 438/479 |
| 4,634,605 | A | * | 1/1987 | Wiesmann | 427/249.5 |
| 6,069,094 | A | * | 5/2000 | Matsumura et al. | 438/788 |
| 6,376,340 | B1 | * | 4/2002 | Sato et al. | 438/488 |
| 6,399,429 | B1 | | 6/2002 | Yamoto et al. | |
| 2003/0221718 | A1 | | 12/2003 | Kubo et al. | |
| 2004/0134429 | A1 | * | 7/2004 | Yamanaka et al. | 118/723 E |
| 2004/0161533 | A1 | * | 8/2004 | Sawayama et al. | 427/248.1 |
| 2005/0132961 | A1 | | 6/2005 | Saito | |

FOREIGN PATENT DOCUMENTS

| | | |
|---|---|---|
| JP | 63040314 A | 2/1988 |
| JP | 06338491 A | 12/1994 |
| JP | 8-250438 A | 9/1996 |
| JP | 2000223419 A | 8/2000 |
| JP | 2002069646 A | 3/2002 |
| JP | 2002198311 A | 7/2002 |
| JP | 2002261020 A | 9/2002 |
| JP | 3453214 B2 | 7/2003 |
| JP | 2004064042 A | 2/2004 |
| JP | 2005-179743 A | 7/2005 |

(Continued)

OTHER PUBLICATIONS

Japanese Office Action for corresponding JP Application No. 2007-112486, Dec. 2, 2008, Japan.

(Continued)

*Primary Examiner*—Thanh V Pham
*Assistant Examiner*—Caleb Henry
(74) *Attorney, Agent, or Firm*—Ditthavong, Mori & Steiner, P.C.

(57) ABSTRACT

A method of manufacturing a semiconductor film capable of suppressing difficulty in temperature control of a catalytic wire is obtained. This method of manufacturing a semiconductor film includes steps of heating a catalytic wire to at least a prescribed temperature and forming a semiconductor film by introducing source gas for a semiconductor and decomposing the source gas with the heated catalytic wire after heating the catalytic wire to at least the prescribed temperature.

16 Claims, 2 Drawing Sheets

FOREIGN PATENT DOCUMENTS

| | | |
|---|---|---|
| JP | 2007046135 A | 2/2007 |
| WO | WO 03/017384 A1 | 2/2003 |

OTHER PUBLICATIONS

Exteneded European Search for corresponding EP Application No. 08251469.6-1235, dated Jun. 23, 2010, pp. 1-8.

Knoesen, et al., "Extension of the lifetime of tantalum filaments in the hot-wire (Cat) Chemical Vapor Deposition process", Thin Solid Films, vol. 516, No. 5 (2008) pp. 822-825.

Van Veen, et al. "Beneficial effect of a low deposition temperature of hot-wire deposited intrinsic amorphous silicon for solar cells", Journal of Applied Physics, vol. 93, No. 1, Jan. 1, 2003, pp. 1-5.

* cited by examiner

METHOD OF MANUFACTURING SEMICONDUCTOR FILM AND METHOD OF MANUFACTURING PHOTOVOLTAIC ELEMENT

BACKGROUND OF THE INVENTION

1. Field of the Invention

The present invention relates to a method of manufacturing a semiconductor film and a method of manufacturing a photovoltaic element, and more particularly, it relates to a method of manufacturing a semiconductor film and a method of manufacturing a photovoltaic element each comprising a step of forming a semiconductor film by decomposing source gas with a catalytic wire.

2. Description of the Background Art

A method of manufacturing a semiconductor film comprising a step of forming a semiconductor film by decomposing source gas with a catalytic wire is known in general, as disclosed in Japanese Patent No. 3453214, for example.

According to the aforementioned Japanese Patent No. 3453214, a gas mixture (source gas) of gas of a silicon compound such as silane ($SiH_4$) and gas of another material such as hydrogen ($H_2$) is introduced into a catalytic body (catalytic wire) supplied with power to be heated to at least the thermal decomposition temperature of the source gas, thereby decomposing the silicon compound and forming a silicon film (semiconductor film) on the surface of a substrate.

However, the aforementioned Japanese Patent No. 3453214 discloses neither the timing for starting supplying power to (starting heating) the catalytic body (catalytic wire) nor the timing for introducing the source gas in formation of the silicon film (semiconductor film). In general, heating of the catalytic body is started and the source gas is introduced at the same time. In this case, the insufficiently heated catalytic wire and the source gas come into contact with each other before the catalytic wire is heated to the silicon melt temperature. Thus, the source gas remains on the catalytic wire, and hence a compound of the catalytic wire and the source gas may be formed on the surface of the catalytic wire. In this case, the resistivity of the catalytic wire changes due to this compound, and hence it is difficult to control the temperature of the heated catalytic wire.

SUMMARY OF THE INVENTION

The present invention has been proposed in order to solve the aforementioned problem, and an object of the present invention is to provide a method of manufacturing a semiconductor film and a method of manufacturing a photovoltaic element each capable of suppressing difficulty in temperature control of a catalytic wire.

A method of manufacturing a semiconductor film according to a first aspect of the present invention comprises steps of heating a catalytic wire to at least a prescribed temperature and forming a semiconductor film by introducing source gas for a semiconductor and decomposing the source gas with the heated catalytic wire after heating the catalytic wire to at least the prescribed temperature.

A method of manufacturing a photovoltaic element according to a second aspect of the present invention comprises steps of heating a catalytic wire to at least a prescribed temperature and forming a semiconductor film functioning as a photoelectric conversion layer by introducing source gas for a semiconductor and decomposing the source gas with the heated catalytic wire after heating the catalytic wire to at least the prescribed temperature.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

First, the structure of a catalytic wire CVD apparatus employed for manufacturing a semiconductor film according to a first embodiment of the present invention is described with reference to FIG. 1.

Figure 1:
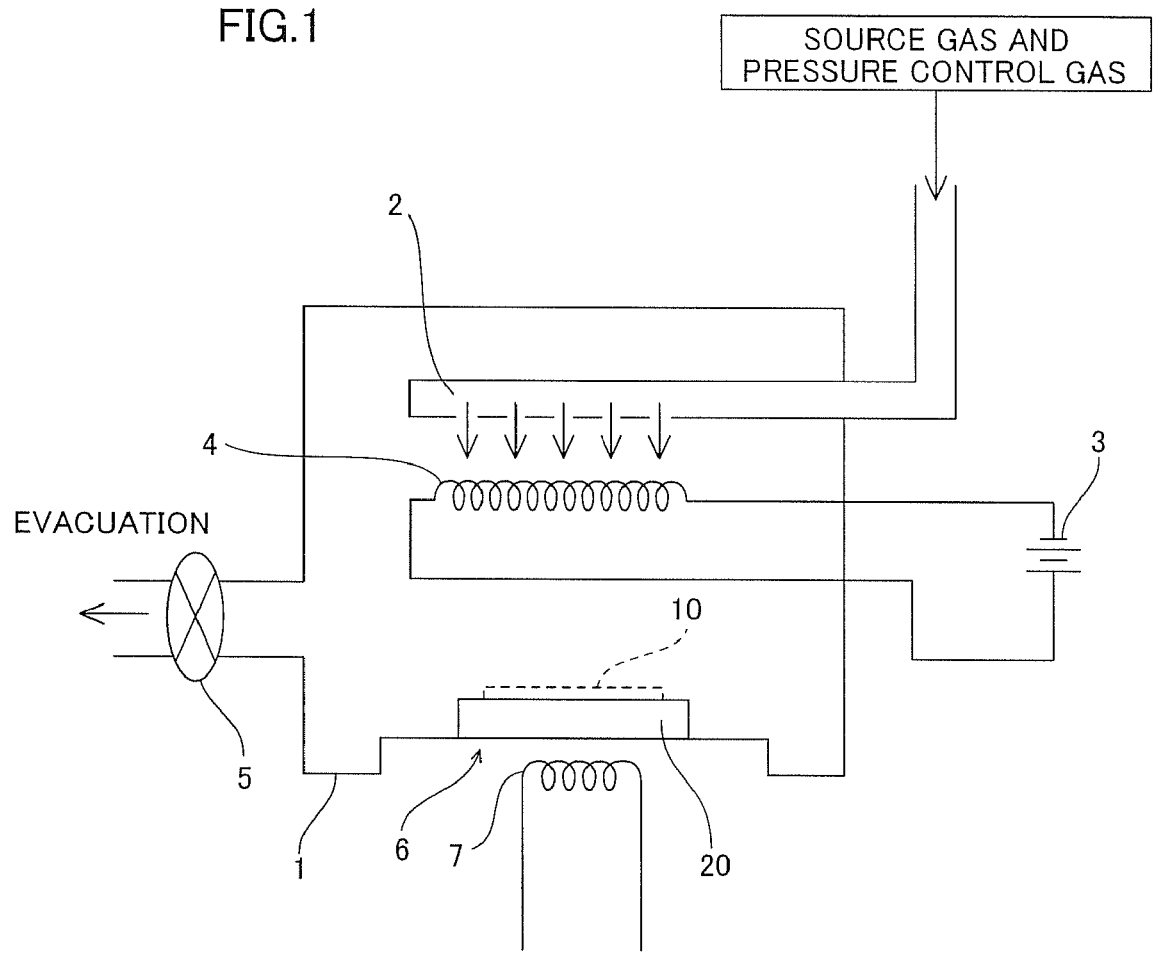
FIG. 1 is a schematic diagram of a catalytic wire CVD apparatus employed in the present invention.

As shown in FIG. 1, the catalytic wire CVD apparatus comprises a reaction chamber 1, a gas supply portion 2 for supplying source gas and pressure control gas into the reaction chamber 1, a catalytic wire 4 connected to a DC power source 3, an exhaust valve 5, a set portion 6 for setting an underlayer 20 for forming a semiconductor film 10 and a heater 7 for heating the underlayer 20 set on the set portion 6.

The catalytic wire 4 is made of tungsten (W). This catalytic wire 4 is heated by excitation with the DC power source 3. The reaction chamber 1 can be evacuated with a vacuum pump (not shown), and the exhaust valve 5 opens/closes an exhaust passage.

A method of manufacturing a semiconductor film according to the first embodiment of the present invention is described with reference to FIG. 1. According to the first embodiment, a hydrogenated amorphous silicon film is formed on the underlayer 20 as the semiconductor film 10. Table 1 shows exemplary conditions for manufacturing the amorphous silicon film.

TABLE 1

| | |
|---|---|
| Material for Catalytic Wire | Tungsten |
| Diameter of Catalytic Wire | 0.5 mm |
| Temperature of Catalytic Wire | 1700° C. |
| Temperature of Underlayer | 200° C. |
| Pressure | 3 Pa |
| Flow Rate of $SiH_4$ | 500 sccm |
| Flow Rate of $H_2$ | 1000 sccm |

As shown in Table 1, the catalytic wire 4 of tungsten having a diameter of about 0.5 mm is employed for forming the amorphous silicon film. The underlayer 20 is set on the set portion 6 of the catalytic wire CVD apparatus provided with this catalytic wire 4. The underlayer 20 is formed by an amorphous silicon film, a transparent conductive oxide film or a single-crystalline silicon substrate, for example. Formation of the amorphous silicon film is started in this state. Table 2 shows manufacturing process conditions for the amorphous silicon film according to the first embodiment.

TABLE 2

| Step | | Heating of Catalytic Wire | Film Formation | Evacuation | End |
|---|---|---|---|---|---|
| First EmbodiMent | Catalytic Wire | ON | ON | ON | OFF |
| | Source Gas | | ON | OFF | |

In order to form the amorphous silicon film by the method of manufacturing a semiconductor film according to the first embodiment, the DC power source 3 excites the catalytic wire 4 thereby heating the catalytic wire 4, as shown in Table 2. The underlayer 20 is heated to about 200° C. with the heater 7, as shown in Table 1. After the catalytic wire 4 is heated to about 1700° C., source gas of $SiH_4$ for forming the amorphous silicon film (semiconductor film 10) and $H_2$ gas are introduced from the supply portion 2 into the reaction chamber 1. As shown in Table 1, $SiH_4$ and $H_2$ are introduced into the reaction chamber 1 under conditions of flow rates of about 500 sccm and about 1000 sccm and a pressure of about 3 Pa respectively. The source gas of $SiH_4$ introduced into the reaction chamber 1 is sprayed onto the catalytic wire 4, to come into contact with the catalytic wire 4. At this time, the catalytic wire 4 is heated to the high temperature of about 1700° C., whereby the source gas of $SiH_4$ cannot remain on the catalytic wire 4. Therefore, the surface of the catalytic wire 4 made of tungsten (W) is inhibited from formation of a compound (tungsten silicide) resulting from $SiH_4$.

The source gas of $SiH_4$ and $H_2$ gas are introduced into the reaction chamber 1 provided with the catalytic wire 4 heated to about 1700° C., so that the catalytic wire 4 decomposes $SiH_4$ and the decomposed species is deposited on the underlayer 20 for forming the hydrogenated amorphous silicon film (semiconductor film 10) on the underlayer 20.

After the formation of the hydrogenated amorphous silicon film, the exhaust valve 5 is opened for evacuating the reaction chamber 1 with the vacuum pump (not shown), as shown in Table 2. After the source gas ($SiH_4$) is substantially exhausted from the reaction chamber 1, the DC power source 3 stops exciting the catalytic wire 4. Thus, the temperature of the catalytic wire 4 is reduced in the state where the source gas is substantially exhausted from the reaction chamber 1. The amorphous silicon film (semiconductor film 10) according to the first embodiment is formed in this manner.

According to the first embodiment, as hereinabove described, the source gas of $SiH_4$ and $H_2$ gas are introduced into the reaction chamber 1 after the catalytic wire 4 of tungsten (W) is heated to about 1700° C. while the amorphous silicon film (semiconductor film 10) is formed by decomposing the source gas with the heated catalytic wire 4 so that the source gas can be introduced in the state where the catalytic wire 4 is heated to about 1700° C., whereby the catalytic wire 4 reliably heated to about 1700° C. and the source gas can be brought into contact with each other. Thus, the source gas can be inhibited from remaining on the catalytic wire 4 dissimilarly to a case where the catalytic wire 4 in an insufficiently heated state (at a temperature of less than about 1700° C.) and the source gas come into contact with each other, whereby formation of a compound (tungsten silicide) of the catalytic wire 4 consisting of tungsten (W) and the source gas of $SiH_4$ can be suppressed at the start of the manufacturing process for the amorphous silicon film (semiconductor film 10). Thus, the resistivity of the catalytic wire 4 can be inhibited from variation resulting from formation of this compound, whereby difficulty in temperature control of the catalytic wire 4 can be suppressed.

According to the first embodiment, as hereinabove described, the source gas is exhausted from the reaction chamber 1 after the formation of the semiconductor film 10 and heating of the catalytic wire 4 heated to about 1700° C. is stopped after the source gas ($SiH_4$) is substantially exhausted from the reaction chamber 1, whereby the catalytic wire 4 and $SiH_4$ can be prevented from coming into contact with each other in a state where the temperature of the catalytic wire 4 is lower than about 1700° C. At the end of the manufacturing process for the amorphous silicon film (semiconductor film 10), therefore, formation of a compound (tungsten silicide) of the catalytic wire 4 made of tungsten (W) and the source gas of $SiH_4$ can be suppressed. Therefore, difficulty in temperature control of the catalytic wire 4 can be suppressed similarly to the above.

Second Embodiment

According to a second embodiment of the present invention, source gas is introduced after the pressure in a reaction chamber 1 is controlled with pressure control gas, dissimilarly to the aforementioned first embodiment. A catalytic wire CVD apparatus employed for manufacturing a semiconductor film 10 according to the second embodiment is similar to that in the aforementioned first embodiment, and hence redundant description is not repeated. According to the second embodiment, an underlayer 20 is formed by an amorphous silicon film.

According to the second embodiment, formation of the semiconductor film 10 is started while the underlayer 20 formed by the amorphous silicon film is set on a set portion 6 of the catalytic wire CVD apparatus. Table 3 shows manufacturing process conditions for the semiconductor film 10 according to the second embodiment. According to the second embodiment, an amorphous silicon film (semiconductor film 10) is formed under the conditions shown in Table 1, similarly to the aforementioned first embodiment.

TABLE 3

| Step | | Heating of Catalytic Wire | Pressure Control | Replacement | Film Formation | Evacuation | End |
|---|---|---|---|---|---|---|---|
| Second Embodiment | Catalytic Wire | ON | ON | ON | ON | ON | OFF |
| | Source Gas | | | ON | ON | OFF | |
| | Pressure Control Gas | | ON | OFF | | | |

In order to form the amorphous silicon film (semiconductor film 10) by a method of manufacturing a semiconductor film according to the second embodiment, a DC power source 3 first starts exciting the catalytic wire 4 thereby heating the catalytic wire 4 to about 1700° C., as shown in Table 3. According to the second embodiment, the pressure in the reaction chamber 1 is thereafter controlled. More specifically, pressure control gas is introduced from a gas supply portion 2, for controlling the reaction chamber 1 to a reaction pressure (about 3 Pa) for forming the amorphous silicon film. The pressure control gas contains no $SiH_4$ or the like for forming the amorphous silicon film (semiconductor film 10), but contains hydrogen ($H_2$) with a partial pressure of at least 50%. When the pressure control gas is introduced into the reaction chamber 1, hydrogen contained in the pressure control gas is decomposed by the catalytic wire 4 heated to about 1700° C., to form hydrogen radicals.

Thereafter the pressure gas and the source gas are replaced. In other words, the gas introduced from the gas supply portion 2 is switched from the pressure control gas containing no $SiH_4$ to the source gas of $SiH_4$ and $H_2$ gas. Thus, the source gas of $SiH_4$ is decomposed by the catalytic wire 4 and amorphous silicon is deposited on the underlayer 20 of amorphous silicon, to form an amorphous silicon film. Then, the reaction chamber 1 is evacuated and heating of the catalytic wire 4 is stopped similarly to the aforementioned first embodiment, thereby completing the manufacturing process for the amorphous silicon film (semiconductor film 10) according to the second embodiment.

underlayer 20 with the hydrogen radicals hardly exerts bad influence on the quality of the underlayer 20.

The remaining effects of the second embodiment are similar to those of the aforementioned first embodiment.

Third Embodiment

According to a third embodiment of the present invention, a catalytic wire 4 is heated after the pressure in a reaction chamber 1 is controlled, dissimilarly to the aforementioned second embodiment controlling the pressure in the reaction chamber 1 after heating the catalytic wire 4. A catalytic wire CVD apparatus employed for manufacturing a semiconductor film 10 according to the third embodiment is similar to that in each of the aforementioned first and second embodiments, and hence redundant description is not repeated. According to the third embodiment, an underlayer 20 is formed by a transparent conductive film consisting of TCO (transparent conductive oxide) such as tin oxide ($SnO_2$) having conductivity and transparency.

According to the third embodiment, formation of a semiconductor film 10 is started while the underlayer 20 formed by the transparent conductive oxide film is set on a set portion 6 of the catalytic wire CVD apparatus. Table 4 shows manufacturing process conditions for the semiconductor film 10 according to the third embodiment. According to the third embodiment, an amorphous silicon film (semiconductor film 10) is formed under the conditions shown in Table 1, similarly to the aforementioned first embodiment.

TABLE 4

| | Step | Pressure Control | Heating of Catalytic Wire | Replacement | Film Formation | Evacuation | End |
|---|---|---|---|---|---|---|---|
| Third Embodiment | Catalytic Wire | | ON | ON | ON | ON | OFF |
| | Source Gas | | | ON | ON | OFF | |
| | Pressure Control Gas | ON | ON | OFF | | | |

According to the second embodiment, as hereinabove described, the pressure control gas and the source gas are replaced while the pressure of the atmosphere for forming the amorphous silicon film (semiconductor film 10) is controlled to the level (about 3 Pa) for film formation, whereby the pressure in the reaction chamber 1 can be inhibited from destabilization immediately after introduction of the source gas, dissimilarly to a case of not controlling the pressure in the reaction chamber 1 with the pressure control gas. Thus, the quality of the amorphous silicon film (semiconductor film 10) can be inhibited from destabilization in an initial state.

According to the second embodiment, as hereinabove described, the pressure in the reaction chamber 1 is controlled with the pressure control gas containing hydrogen ($H_2$) with the partial pressure of at least 50% when the underlayer 20 is made of amorphous silicon, whereby a compound (tungsten silicide) formed on the catalytic wire 4 can be reduced through etching with hydrogen. Thus, the resistivity of the catalytic wire 4 can be inhibited from variation resulting from a silicide formed on the catalytic wire 4. The underlayer 20 of amorphous silicon originally has an irregular network structure of the atomic level, and hence the etching function on the In order to form the semiconductor film 10 by a method of manufacturing a semiconductor film according to the third embodiment, pressure control gas is introduced from a gas supply portion 2 for controlling the reaction chamber 1 to a reaction pressure (about 3 Pa) for forming the amorphous silicon film, as shown in Table 4. The pressure control gas contains no $SiH_4$ or the like for forming the semiconductor film 10, but contains Ar gas with a partial pressure of at least 50% with no hydrogen or a small quantity of hydrogen. Thereafter a DC power source 3 starts exciting the catalytic wire 4, thereby heating the catalytic wire 4 to about 1700° C. Thereafter the source gas and the pressure control gas are replaced, the semiconductor film 10 is formed, the reaction chamber 1 is evacuated and the DC power source 3 stops exciting the catalytic wire 4 similarly to the aforementioned second embodiment, and the semiconductor film 10 according to the third embodiment is completely manufactured.

According to the third embodiment, as hereinabove described, the pressure in the reaction chamber 1 is controlled with the pressure control gas containing Ar gas with the partial pressure of at least 50% with no hydrogen or a small quantity of hydrogen when the underlayer 20 is formed by a transparent conductive film of TCO such as tin oxide ($SnO_2$), whereby the transparent conductive film can be prevented from damage resulting from reduction with hydrogen, dissimilarly to a case where the pressure control gas contains a large quantity of hydrogen. Also when made of single-crystalline silicon (c-Si), the underlayer 20 may be damaged by etching with hydrogen radicals decomposed by the catalytic wire 4 or the if the pressure control gas contains hydrogen. Therefore, the pressure control gas preferably contains non-hydrogen gas (such as Ar gas) with a partial pressure of at least 50%.

The remaining effects of the third embodiment are similar to those of the aforementioned first embodiment.

Fourth Embodiment

According to a fourth embodiment of the present invention, a thin-film photovoltaic element 100 is manufactured by the method of manufacturing a semiconductor film according to each of the aforementioned second and third embodiments. First, the structure of the thin-film photovoltaic element 100 manufactured by the method of manufacturing a semiconductor film according to the present invention is described with reference to FIG. 2.

Figure 2:
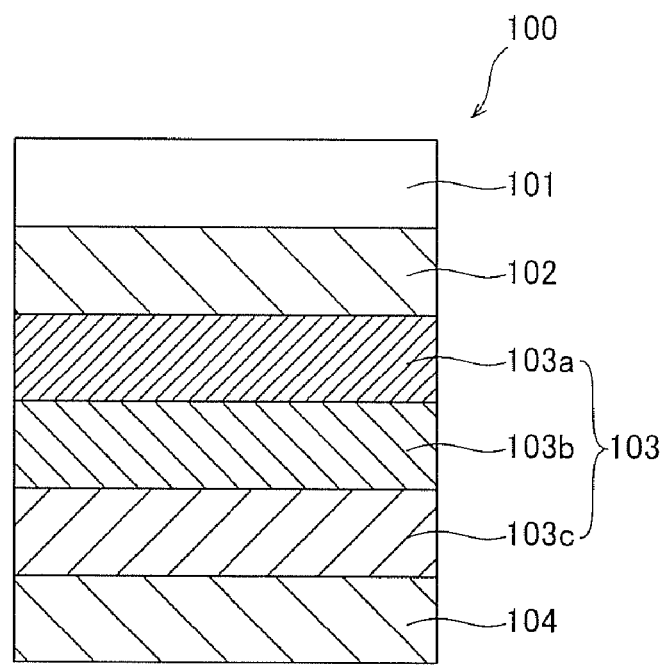
FIG. 2 is a sectional view of a thin-film photovoltaic element manufactured according to the present invention.

As shown in FIG. 2, the photovoltaic element 100 comprises a substrate 101, a surface electrode layer 102, a photoelectric conversion layer 103 and a rear electrode layer 104.

The substrate 101 has an insulating surface, and is made of glass having transparency. The surface electrode layer 102 is formed on the upper surface of the substrate 101. This surface electrode layer 102 is formed by a TCO (transparent conductive oxide) film of tin oxide ($SnO_2$) or the like having conductivity and transparency.

The photoelectric conversion layer 103 made of a p-i-n-type amorphous silicon-based semiconductor is formed on the upper surface of the surface electrode layer 102. This photoelectric conversion layer 103 of the p-i-n-type amorphous silicon-based semiconductor is constituted of a p-type hydrogenated amorphous silicon carbide (a-SiC:H) layer 103a (hereinafter referred to as a p layer 103a), an i-type hydrogenated amorphous silicon (a-Si:H) layer 103b (hereinafter referred to as an i layer 103b) and an n-type hydrogenated amorphous silicon (a-Si:H) layer 103c (hereinafter referred to as an n layer 103c).

The rear electrode layer 104 is formed on the upper surface of the photoelectric conversion layer 103. The rear electrode layer 104 is formed by holding the front and back surfaces of a silver (Ag) layer with a pair of ZnO layers.

A manufacturing process for the photovoltaic element 100 shown in FIG. 2 is now described. In the manufacturing process for the photovoltaic element 100, the surface electrode layer 102 of tin oxide is first formed on the upper surface of the substrate 101 having the insulating surface by thermal CVD (chemical vapor deposition).

Then, the p layer (p-type hydrogenated amorphous silicon carbide layer) 103a, the i layer (i-type hydrogenated amorphous silicon layer) 103b and the n layer (n-type hydrogenated amorphous silicon layer) 103c are successively formed on the upper surface of the surface electrode layer 102 by catalytic wire CVD, thereby forming the photoelectric conversion layer 103 of the amorphous silicon-based semiconductor. At this time, the p layer (p-type hydrogenated amorphous silicon carbide layer) 103a is formed on the surface electrode layer 102 consisting of the transparent conductive oxide film by controlling the pressure in a reaction chamber 1 with pressure control gas containing no hydrogen or a small quantity of hydrogen, thereafter heating a catalytic wire 4 (see FIG. 1) and thereafter introducing source gas, similarly to the aforementioned third embodiment. Further, the i layer 103b is formed on the p layer 103a and the n layer 103c is formed on the i layer 103b by controlling the pressure in the reaction chamber 1 with pressure control gas containing hydrogen with a partial pressure of at least 50%, thereafter heating the catalytic wire 4 (see FIG. 1) and thereafter introducing the source gas, similarly to the aforementioned second embodiment.

Thereafter the rear electrode layer 104 consisting of the metallic material layers (the ZnO layer (upper layer), the Ag layer (intermediate layer) and the ZnO layer (lower layer)) mainly composed of silver is formed on the upper surface of the photoelectric conversion layer 103 (n layer 103c) by sputtering. The thin-film photovoltaic element 100 is manufactured in this manner.

According to the fourth embodiment, as hereinabove described, the thin-film photovoltaic element 100 is manufactured by the method of manufacturing a semiconductor film according to each of the aforementioned second and third embodiments, whereby formation of a compound (tungsten silicide) of the catalytic wire 4 made of tungsten (W) and the source gas of $SiH_4$ can be suppressed when the photovoltaic element 100 is manufactured. Therefore, the resistivity of the catalytic wire 4 can be inhibited from variation resulting from formation of this compound, whereby difficulty in temperature control of the catalytic wire 4 can be suppressed. Thus, the quality of the thin-film photovoltaic element 100 manufactured by the catalytic CVD can be stabilized.

Fifth Embodiment

According to a fifth embodiment of the present invention, a heterojunction photovoltaic element 200 is manufactured by the method of manufacturing a semiconductor film according to each of the aforementioned second and third embodiments. First, the structure of the heterojunction photovoltaic element 200 manufactured by the method of manufacturing a semiconductor film according to the present invention is described with reference to FIG. 3.

Figure 3:
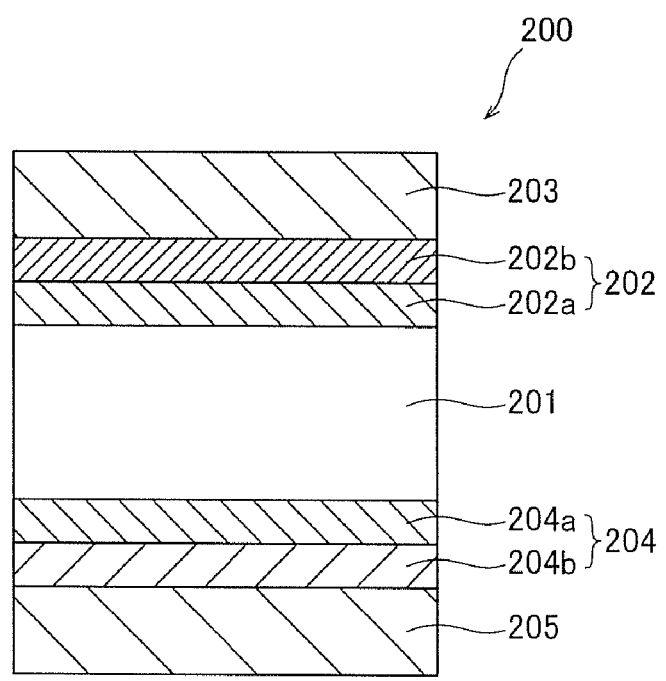
FIG. 3 is a sectional view showing a heterojunction photovoltaic element manufactured according to the present invention.

In the photovoltaic element 200 according to the fifth embodiment, an amorphous silicon (a-Si) layer 202 and a surface electrode layer 203 are successively formed on the upper surface of an n-type single-crystalline silicon (c-Si) substrate 201, as shown in FIG. 3. The surface electrode layer 203 is formed by a transparent conductive oxide film of ITO (indium tin oxide). The amorphous silicon layer 202 is constituted of a substantially intrinsic i-type amorphous silicon layer 202a formed on the upper surface of the n-type single-crystalline silicon substrate 201 and a p-type amorphous silicon layer 202b doped with boron (B) formed on the i-type amorphous silicon layer 202a. The i-type amorphous silicon layer 202a has a small thickness, in order not to substantially contribute to power generation as an optical active layer.

An amorphous silicon layer 204 and a rear electrode layer 205 are formed on the back surface of the n-type single-crystalline silicon substrate 201 successively from the side closer to the back surface of the n-type single-crystalline silicon substrate 201. The rear electrode layer 205 is formed by a transparent conductive oxide film of ITO. The amorphous silicon layer 204 is constituted of a substantially intrinsic i-type amorphous silicon layer 204a formed on the back surface of the n-type single-crystalline silicon substrate 201 and an n-type amorphous silicon layer 204b doped with phosphorus (P) formed on the back surface of the i-type amorphous silicon layer 204a. The i-type amorphous silicon layer 204a has a small thickness, in order not to substantially contribute to power generation. The i-type amorphous silicon layer 204a, the n-type amorphous silicon layer 204b and the rear electrode layer 205 constitute the so-called BSF (back surface field) structure.

A manufacturing process for the photovoltaic element 200 is now described with reference to FIG. 3.

First, the n-type single-crystalline silicon substrate 201 is cleaned and set in a vacuum chamber (not shown) and thereafter heated under a temperature condition of not more than 200° C., for removing moisture adhering to the surface of the n-type single-crystalline silicon substrate 201 to the utmost. Thus, oxygen contained in the moisture adhering to the surface of the n-type single-crystalline silicon substrate 201 is inhibited from binding to silicon and forming defects.

Then, hydrogen ($H_2$) gas is introduced while keeping the substrate temperature at 170° C., for hydrogenating the upper surface of the n-type single-crystalline silicon substrate 201. Thus, the upper surface of the n-type single-crystalline silicon substrate 201 is cleaned, and hydrogen atoms are adsorbed around the upper surface of the n-type single-crystalline silicon substrate 201. The adsorbed hydrogen atoms inactivate (terminate) defects on the upper surface of the n-type single-crystalline silicon substrate 201.

Thereafter the respective layers are formed on the front and back surfaces of the n-type single-crystalline silicon substrate 201.

More specifically, the i-type amorphous silicon layer 202a is formed on the upper surface of the n-type single-crystalline silicon substrate 201 by catalytic wire CVD. At this time, the i-type amorphous silicon layer 202a is formed by controlling the pressure in the reaction chamber 1 with pressure control gas containing no hydrogen or a small quantity of hydrogen, thereafter heating a catalytic wire 4 (see FIG. 1) and thereafter introducing source gas, similarly to the aforementioned third embodiment.

Then, the p-type amorphous silicon layer 202b doped with boron (B) is formed on the i-type amorphous silicon layer 202a by catalytic wire CVD. At this time, the p-type amorphous silicon layer 202b is formed by controlling the pressure in the reaction chamber 1 with pressure control gas containing hydrogen with a partial pressure of at least 50%, thereafter heating the catalytic wire 4 (see FIG. 1) and thereafter introducing the source gas, similarly to the aforementioned second embodiment.

Then, the surface electrode layer 203 of ITO (indium tin oxide) is formed on the upper surface of the p-type amorphous silicon layer 202b by sputtering.

Then, the i-type amorphous silicon layer 204a is formed on the back surface of the n-type single-crystalline silicon substrate 201 by catalytic wire CVD. At this time, the i-type amorphous silicon layer 204a is formed by controlling the pressure in the reaction chamber 1 with pressure control gas containing no hydrogen or a small quantity of hydrogen, thereafter heating the catalytic wire 4 (see FIG. 1) and thereafter introducing the source gas, similarly to the aforementioned third embodiment.

Then, the n-type amorphous silicon layer 204b doped with phosphorus (P) is formed on the back surface of the i-type amorphous silicon layer 204a by catalytic wire CVD. At this time, the n-type amorphous silicon layer 204b is formed by controlling the pressure in the reaction chamber 1 with pressure control gas containing hydrogen with a partial pressure of at least 50%, thereafter heating the catalytic wire 4 (see FIG. 1) and thereafter introducing the source gas, similarly to the aforementioned second embodiment.

Finally, the rear electrode layer 205 of ITO is formed on the back surface of the n-type amorphous silicon layer 204b by sputtering. The heterojunction photovoltaic element 200 shown in FIG. 3 is formed in this manner.

According to the fifth embodiment, as hereinabove described, the heterojunction photovoltaic element 200 is manufactured by the method of manufacturing a semiconductor film according to each of the aforementioned second and third embodiments, whereby the quality of the heterojunction photovoltaic element 200 manufactured by the catalytic CVD can be stabilized similarly to the aforementioned fourth embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while silane ($SiH_4$) gas is employed as the source gas in each of the aforementioned embodiments, the present invention is not restricted to this but another silane-based gas such as disilane ($Si_2H_6$) or trisilane ($Si_3H_8$) may alternatively be employed, or silicon fluoride-based gas such as $SiF_2$ or $SiH_2F_2$ may be employed.

While the catalytic wire 4 is made of tungsten (W) in each of the aforementioned embodiments, the present invention is not restricted to this but a catalytic wire made of another high-melting point material such as tantalum (Ta) may alternatively be employed.

While the amorphous silicon film is formed on the underlayer 20 as the semiconductor film 10 under the film forming conditions shown in Table 1 in each of the aforementioned embodiments, the present invention is not restricted to this but a semiconductor film of microcrystalline silicon or polycrystalline silicon may alternatively be formed on the underlayer 20 as the semiconductor film 10 by changing the film forming conditions.

While the non-hydrogen gas (Ar gas) with the partial pressure of at least 50% is employed as the pressure control gas in the aforementioned third embodiment, the present invention is not restricted to this but rare gas such as neon (N) gas, fluorine ($F_2$) gas, chlorine ($Cl_2$) gas, nitrogen ($N_2$) gas, carbon dioxide ($CO_2$) gas or methane ($CH_4$) gas may alternatively be employed as the non-hydrogen gas.

While the reaction chamber 1 is evacuated with the vacuum pump in each of the aforementioned embodiments, the present invention is not restricted to this but the reaction chamber 1 may alternatively be evacuated with supply of gas ($H_2$ gas or Ar gas) containing no film forming species such as $SiH_4$. Thus, the speed for exhausting $SiH_4$ from the reaction chamber 1 can be increased. After film formation, the source gas ($SiH_4$) may simply be exhausted, while the remaining gas ($H_2$ gas or the like) may remain in the reaction chamber 1. When $H_2$ gas remains in the reaction chamber 1, a compound (silicide) formed on the surface of the catalytic wire 4 can be removed by etching.

While the amorphous silicon film is formed by heating the catalytic wire 4 to about 1700° C., thereafter controlling the pressure in the reaction chamber 1 with the pressure control gas and thereafter introducing the source gas in the aforementioned second embodiment, the present invention is not restricted to this but the amorphous silicon film may alternatively be formed by heating the catalytic wire 4 to about 1200° C., thereafter controlling the pressure in the reaction chamber 1 with pressure control gas, thereafter heating the catalytic wire 4 to about 1700° C. and thereafter introducing the source gas when controlling the pressure in the reaction chamber 1 with pressure control gas containing hydrogen gas. Thus, decomposition of hydrogen is suppressed when controlling the pressure in the reaction chamber 1, whereby damage of the underlayer 20 resulting from hydrogen radicals caused by decomposition of hydrogen can be reduced. In this case, the underlayer 20 is not restricted to the amorphous silicon film, but may alternatively be formed by a transparent conductive oxide film or a single-crystalline silicon (c-Si) film.

While the thin-film photovoltaic element 100 and the heterojunction photovoltaic element 200 are manufactured in the aforementioned fourth and fifth embodiments respectively, the present invention is not restricted to these but is generally applicable to a photoelectric element having a semiconductor film manufactured by catalytic wire CVD. Further, the present invention is not restricted to the photovoltaic element but is generally applicable to a semiconductor element having a semiconductor film manufactured by catalytic wire CVD.

What is claimed is:

1. A method of manufacturing a semiconductor film comprising steps of:
    heating a catalytic wire to at least a prescribed temperature; and
    forming a semiconductor film by introducing source gas for a semiconductor and decomposing said source gas with heated said catalytic wire after heating said catalytic wire to at least said prescribed temperature, wherein:
    said step of forming said semiconductor film includes a step of introducing said source gas while controlling the pressure of an atmosphere for forming said semiconductor film to a prescribed level with pressure control gas containing no said source gas,
    said pressure control gas contains hydrogen, and
    said step of heating said catalytic wire to at least said prescribed temperature includes steps of:
        setting said catalytic wire to a temperature lower than said prescribed temperature when controlling the pressure of said atmosphere to said prescribed level with said pressure control gas before introducing said source gas, and
        heating said catalytic wire to at least said prescribed temperature before introducing said source gas after controlling the pressure of said atmosphere to said prescribed level with said pressure control gas.

2. The method of manufacturing a semiconductor film according to claim 1, further comprising steps of:
    exhausting said source gas after forming said semiconductor film; and
    stopping heating said catalytic wire heated to at least said prescribed temperature after substantially exhausting said source gas.

3. The method of manufacturing a semiconductor film according to claim 1, wherein
    said step of forming said semiconductor film includes a step of depositing said decomposed source gas on an underlayer thereby forming said semiconductor film on said underlayer.

4. The method of manufacturing a semiconductor film according to claim 3, wherein
    said underlayer includes an amorphous silicon film, a transparent conductive oxide film or a single-crystalline silicon substrate.

5. The method of manufacturing a semiconductor film according to claim 1, wherein
    said step of forming said semiconductor film includes a step of depositing said decomposed source gas on an underlayer thereby forming said semiconductor film on said underlayer, and
    said pressure control gas contains hydrogen with a partial pressure of at least 50% when said underlayer for said semiconductor film is made of amorphous silicon.

6. The method of manufacturing a semiconductor film according to claim 1, wherein
    said step of forming said semiconductor film includes a step of depositing said decomposed source gas on an underlayer thereby forming said semiconductor film on said underlayer, and
    said pressure control gas contains non-hydrogen gas with a partial pressure of at least 50% when said underlayer for said semiconductor film is formed by a transparent conductive oxide film.

7. The method of manufacturing a semiconductor film according to claim 1, wherein
    said source gas includes silane gas, and
    said prescribed temperature is at least 1700° C.

8. The method of manufacturing a semiconductor film according to claim 1, wherein
    said source gas includes silane gas, and
    said catalytic wire is made of a metal forming a silicide by coming into contact with said silane gas.

9. A method of manufacturing a photovoltaic element comprising steps of:
    heating a catalytic wire to at least a prescribed temperature; and
    forming a semiconductor film functioning as a photoelectric conversion layer by introducing source gas for a semiconductor and decomposing said source gas with heated said catalytic wire after heating said catalytic wire to at least said prescribed temperature, wherein:
    said step of forming said semiconductor film includes a step of introducing said source gas while controlling the pressure of an atmosphere for forming said semiconductor film to a prescribed level with pressure control gas containing no said source gas,
    said pressure control gas contains hydrogen, and
    said step of heating said catalytic wire to at least said prescribed temperature includes steps of:
        setting said catalytic wire to a temperature lower than said prescribed temperature when controlling the pressure of said atmosphere to said prescribed level with said pressure control gas before introducing said source gas, and
        heating said catalytic wire to at least said prescribed temperature before introducing said source gas after controlling the pressure of said atmosphere to said prescribed level with said pressure control gas.

10. The method of manufacturing a photovoltaic element according to claim 9, further comprising steps of:
    exhausting said source gas after forming said semiconductor film; and
    stopping heating said catalytic wire heated to at least said prescribed temperature after substantially exhausting said source gas.

11. The method of manufacturing a photovoltaic element according to claim 9, wherein
    said step of forming said semiconductor film includes a step of depositing said decomposed source gas on an underlayer thereby forming said semiconductor film on said underlayer.

12. The method of manufacturing a photovoltaic element according to claim 11, wherein
    said underlayer includes an amorphous silicon film, a transparent conductive oxide film or a single-crystalline silicon substrate.

13. The method of manufacturing a photovoltaic element according to claim 1, wherein
   said step of forming said semiconductor film includes a step of depositing said decomposed source gas on an underlayer thereby forming said semiconductor film on said underlayer, and
   said pressure control gas contains hydrogen with a partial pressure of at least 50% when said underlayer for said semiconductor film is made of amorphous silicon.

14. The method of manufacturing a photovoltaic element according to claim 1, wherein
   said step of forming said semiconductor film includes a step of depositing said decomposed source gas on an underlayer thereby forming said semiconductor film on said underlayer, and
   said pressure control gas contains non-hydrogen gas with a partial pressure of at least 50% when said underlayer for said semiconductor film is formed by a transparent conductive oxide film.

15. The method of manufacturing a photovoltaic element according to claim 9, wherein
   said source gas includes silane gas, and
   said prescribed temperature is at least 1700° C.

16. The method of manufacturing a photovoltaic element according to claim 9, wherein
   said source gas includes silane gas, and
   said catalytic wire is made of a metal forming a silicide by coming into contact with said silane gas.

* * * * *